United States Patent
Yun (10) Patent No.: US 8,385,103 B2
(45) Date of Patent: Feb. 26, 2013

(54) NON-VOLATILE MEMORY DEVICE (75) Inventor: Sun Hyuck Yun, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 131 days.

(21) Appl. No.: 12/972,365

(22) Filed: Dec. 17, 2010

(65) Prior Publication Data

US 2012/0054529 A1   Mar. 1, 2012

(30) Foreign Application Priority Data

Aug. 30, 2010  (KR) .......................... 10-2010-0084016

(51) Int. Cl.
*G11C 11/00*  (2006.01)
(52) U.S. Cl. ............... 365/148; 365/189.04; 365/230.03
(58) Field of Classification Search .................. 365/148, 365/189.04, 230.03
See application file for complete search history.

(56) References Cited

U.S. PATENT DOCUMENTS

| | | | |
|---|---|---|---|
| 6,894,943 B2 * | 5/2005 | Suzuki et al. | 365/230.03 |
| 6,937,535 B2 * | 8/2005 | Ahn et al. | 365/222 |
| 7,088,637 B2 * | 8/2006 | Ko et al. | 365/230.03 |
| 7,218,548 B2 * | 5/2007 | Kang et al. | 365/149 |
| 7,263,014 B2 | 8/2007 | Chun | |
| 7,304,877 B2 * | 12/2007 | Ko et al. | 365/51 |
| 7,684,229 B2 * | 3/2010 | Leung | 365/149 |
| 2004/0060031 A1 | 3/2004 | Cernea | |

FOREIGN PATENT DOCUMENTS

| | | |
|---|---|---|
| KR | 1020050084582 A | 8/2005 |
| KR | 100576505 B1 | 4/2006 |
| KR | 1020100076657 A | 7/2010 |

* cited by examiner

*Primary Examiner* — Pho M Luu (57) ABSTRACT

A non-volatile memory device includes a bank including a plurality of unit cells so as to output sensed data to a global input/output (I/O) line, and a data input/output (I/O) unit configured to store the same data as that of a unit cell contained in a bank in a register, store external input data in the register during a write operation, and output data stored in the register to an external part during a read operation.

23 Claims, 5 Drawing Sheets

NON-VOLATILE MEMORY DEVICE

CROSS-REFERENCE TO RELATED APPLICATION

The priority of Korean patent application No. 10-2010-0084016 filed on Aug. 30, 2010, the disclosure of which is hereby incorporated in its entirety by reference, is claimed.

BACKGROUND OF THE INVENTION

Embodiments of the present invention relate to a non-volatile memory device configured to use the Low Power Double Data Rate (LPDDR) 2 specification.

Memory devices can be classified into a volatile memory device and a non-volatile memory device. The non-volatile memory device uses a non-volatile memory cell capable of preserving stored data without a power supply. For example, the non-volatile memory device may be implemented as a flash Random Access Memory (Flash RAM), a Phase Change Random Access Memory (PCRAM), or the like.

The PCRAM is a memory cell which uses a phase change material such as germanium antimony tellurium (GST) whose phase is inter-changeable between a crystalline phase and an amorphous phase depending on the temperature applied to the GST.

A non-volatile memory, e.g., a magnetic memory, a phase change memory (PCM), or the like, has a data processing speed similar to that of a volatile RAM. The non-volatile memory also preserves data even when power is turned off.

Figure 1A:
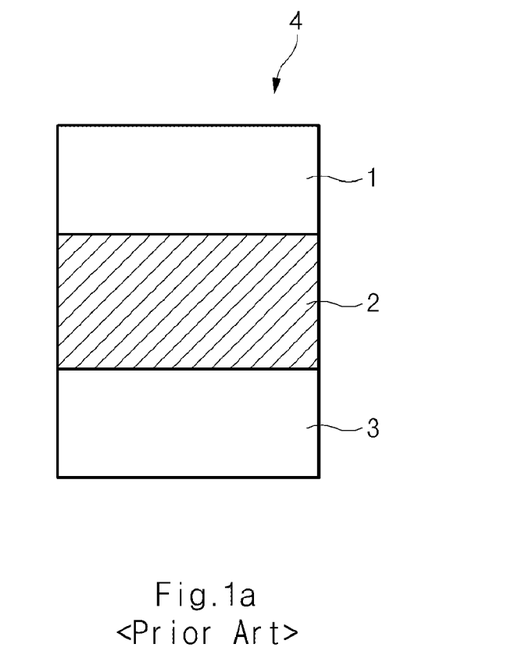
FIGS. 1A and 1B illustrate a conventional Phase Change Resistor (PCR).
Figure 1B:
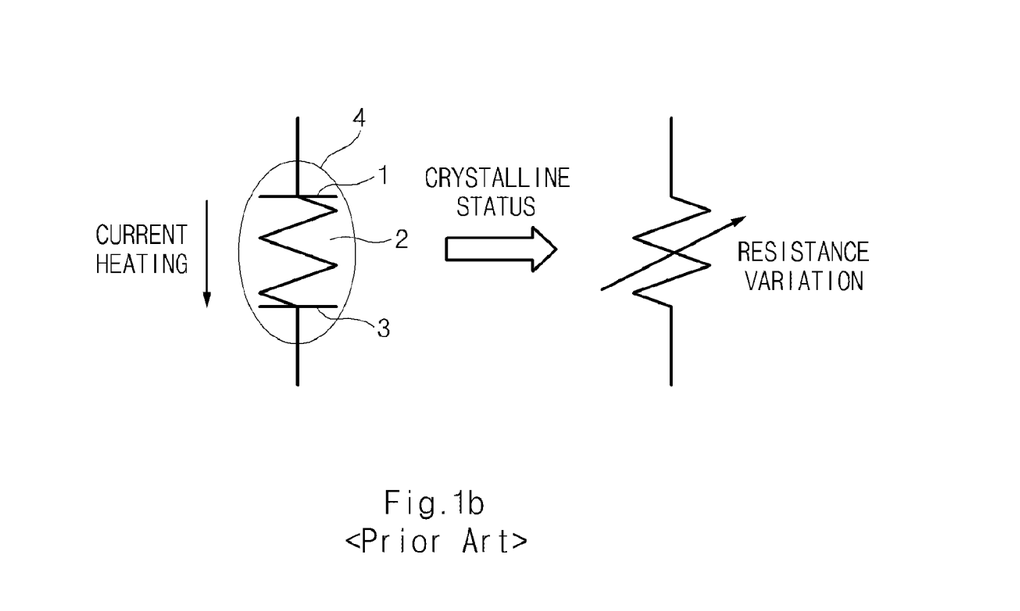

FIGS. 1A and 1B illustrate a conventional Phase Change Resistor (PCR).

Referring to FIGS. 1A and 1B, the phase change resistor (PCR) 4 includes a top electrode 1, a bottom electrode 3, and a phase change material (PCM) layer 2 located between the top electrode 1 and the bottom electrode 3. If a voltage and current are applied to the top electrode 1 and the bottom electrode 3, a current signal and a high temperature are provided to the PCM layer 2 such that an electrical conductive status of the PCM layer 2 is changed.

Figure 2A:
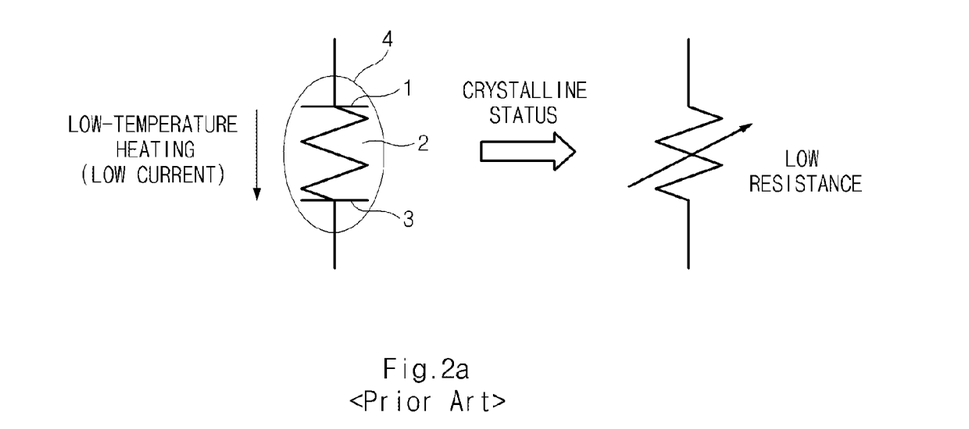
FIGS. 2A and 2B illustrate a data storage operation of a conventional phase change resistor (PCR).
Figure 2B:
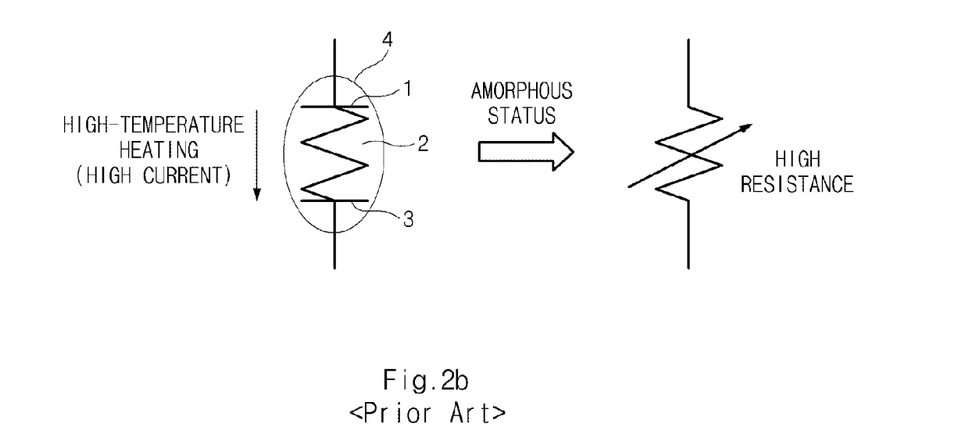

FIGS. 2A and 2B illustrate data storage operation of a conventional phase change resistor (PCR).

Referring to FIG. 2A, when a low current below a threshold value is applied to the phase change resistor (PCR) 4, the PCM layer 2 is kept at a temperature suitable for a crystalline phase. Therefore, the PCM layer 2 is in a crystalline phase with low-resistance. As a result, a current may flow between the top electrode 1 and the bottom electrode 3.

On the other hand, as shown in FIG. 2B, when a high current higher than the threshold value is applied to the phase change resistor (PCR) 4, the PCM layer 2 is at a temperature higher than a melting point. Therefore, the PCM layer 2 is in an amorphous phase with high-resistance. As a result, it is difficult for the current to flow between the top electrode 1 and the bottom electrode 3.

Therefore, the PCR 4 may store data corresponding to two resistance phases. For example, when the PCR 4 in a low-resistance phase is set to data '1' and the PCR 4 in a high-resistance phase is set to data '0', the PCR 4 may store two logic states for data.

In addition, a phase of the PCM layer (i.e., a phase change resistive material) 2 is not changed although power to the phase change memory is cut off, and thus data can be stored in a non-volatile manner.

Figure 3:
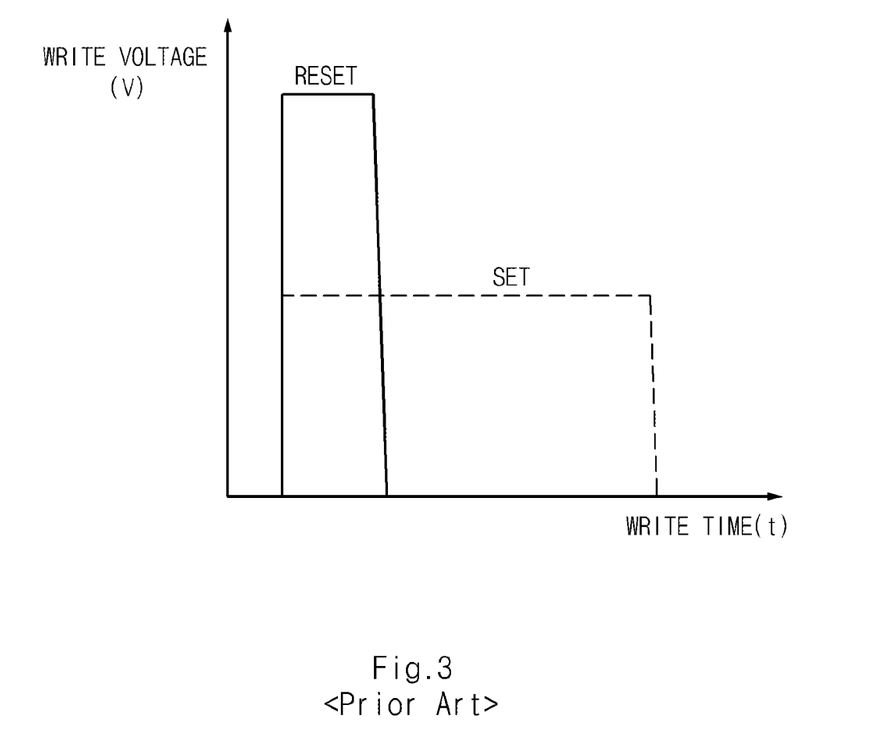
FIG. 3 illustrates a write operation of a conventional Phase Change Resistor (PCR) cell.

FIG. 3 illustrates a write operation of the conventional Phase Change Resistor (PCR) cell.

Referring to FIG. 3, when a current flows between the top electrode 1 and the bottom electrode 3 of the PCR 4 during a predetermined time, heat is generated.

Assuming that a low current below a threshold value flows in the PCR 4 during a predetermined time, the phase change material 2 is at a crystalline phase due to a low-temperature applied, and thus the PCR 4 serving as a low-resistance element is at a set status.

Otherwise, assuming that a high current higher than the threshold value flows in the PCR 4 during the predetermined time, the phase change material (i.e., PCM layer) 2 is at an amorphous phase due to a high-temperature, and thus the PCR 4 is at a reset status.

By means of the aforementioned properties, in order for data of the set status to be written during a write operation mode, a low voltage is applied to the PCR 4 for a long period of time. On the other hand, in order for data of the reset status to be written during the write operation mode, a high voltage is applied to the PCR 4 for a short period of time.

The phase change resistance (PCR) memory outputs a sensing current to the PCR 4 during the sensing operation, such that it can sense data written in the PCR 4.

BRIEF SUMMARY OF THE INVENTION

Various embodiments of the present invention are directed to providing a non-volatile memory device that substantially obviates one or more problems due to limitations and disadvantages of the related art.

An embodiment of the present invention relates to a Low Power Double Data Rate (LPDDR) 2 specification—based non-volatile memory device that allows a Row Data Buffer (RDB) array for the read or write operation of data to approach a DQ pad, such that it reduces a memory area and implements a high-speed operation.

In accordance with one embodiment of the present invention, the non-volatile memory device includes a bank including a plurality of unit cells and configured to output sensed data to a global input/output (I/O) line, and a data input/output (I/O) unit including a register and configured to store the sensed data in the register, the data input/output (I/O) unit being configured to store external input data in the register during a write operation and output data stored in the register to an external node during a read operation.

In accordance with another embodiment of the present invention, the non-volatile memory device includes a bank including a plurality of unit cells and configured to output sensed data to a global input/output (I/O) line, a data transmitting unit configured to receive data from the bank through the global input/output (I/O) line or receive external input data, a data storing unit configured to store data received from the data transmitting unit or the external input data received through the data input/output (I/O) pad, a data output driving unit configured to drive data stored in the data storing unit, and output the driven data to the data input/output (I/O) pad, and a data input buffer configured to buffer data received through the data input/output (I/O) pad, and output the buffered data to the data storing unit.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 4:
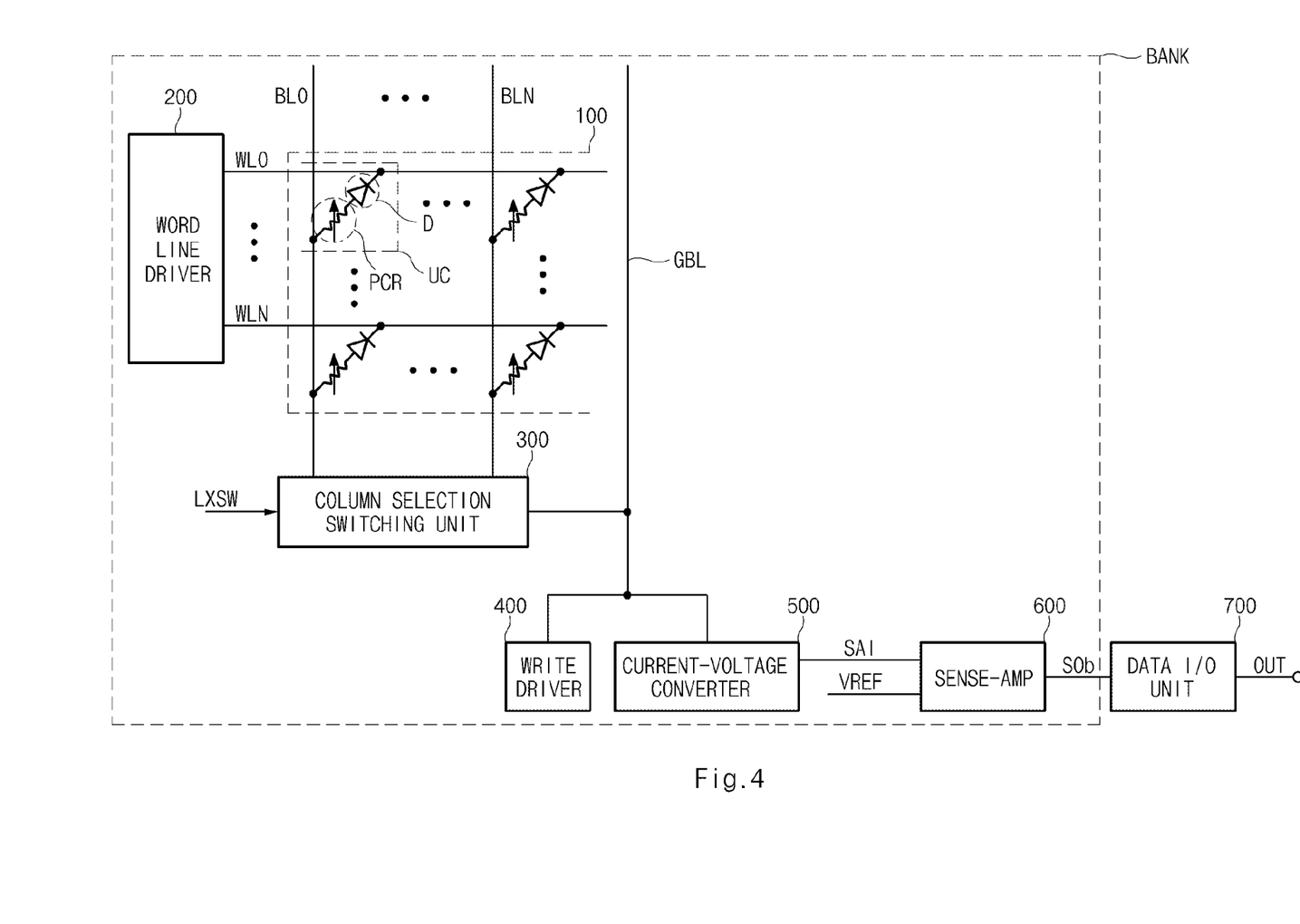
FIG. 4 is a circuit diagram illustrating a non-volatile memory device according to an embodiment of the present invention.

FIG. 4 is a circuit diagram illustrating a non-volatile memory device according to an embodiment of the present invention.

Referring to FIG. 4, the non-volatile memory device according to an embodiment of the present invention includes a cell array 100, a word line driver 200, a column selection switching unit 300, a write driver 400, a current-voltage converter 500, a sense-amplifier (sense-amp) 600, and a data input/output (I/O) unit 700.

In this case, the elements other than the data I/O unit 700, i.e., the cell array 100, the word line driver 200, the column selection switching unit 300, the write driver 400, the current-voltage converter 500, and the sense-amp 600 are integrally called a bank.

The cell array 100 includes a plurality of unit cells (UCs) and switching elements. Each unit cell (UC) is located at an intersection of a bit line BL and a word line (WL). Each unit cell (UC) includes a memory element, and data is stored in each memory element.

Herein, the memory element may be any one of various non-volatile memory elements, for example, a ferroelectric capacitor, a phase change memory element, a Spin Torque Transfer (STT) element, a magneto-resistive element, and the like.

In accordance with an embodiment of the present invention, each unit cell (Us) contained in the cell array 100 may include a phase change resistor.

For example, FIG. 4 shows a non-volatile memory device employing a phase change resistor (PCR) and a diode D as a switching element. However, the scope and type of non-volatile memory and switching element are not limited thereto.

The PCR is connected between the bit line BL and the diode D such that it stores data therein. A resistance value of the PCR is changed in response to the stored data.

As a switching element, a diode D is advantageous in reducing a cell area. The diode D is connected between the phase change resistor (PCR) and the word line WL. The diode D enables a current to flow in a forward direction, and prevents the current from flowing in a reverse direction. In the phase change memory device according to an embodiment of the present invention, the direction from the bit line BL to the word line WL may be set to the forward direction as an example.

The cell array 100 is connected to the column selection switching unit 300 through bit lines BL0~BLN, and is connected to the word line driver 200 through word lines WL0~WLN.

When the word line driver 200 performs the sensing operation for one or more unit cells (UCs), the word line WL to which the corresponding unit cell (UC) is connected is activated. The word line driver 200 provides a low-level voltage to the word line WL so as to activate the word line WL.

For example, provided that the sensing operation is performed for the unit cells UC connected to word lines WL0 and WL1, the word line driver 200 activates the word lines WL0 or WL1 and deactivates the other word lines WL2~WLN.

The column selection switching unit 300 selects one of the plurality of bit lines BL0~BLN in response to the column selection signal LXSW. The bit line BL selected by a column selection signal LXSW is connected to a global bit line GBL.

The write driver 400 generates a driving voltage corresponding to input data during the write operation, and outputs the driving voltage to the cell array 200 through the global bit line GBL and the column selection switching unit 300.

If the word line driver 200 drives the word line WL at a low-level voltage, the write driver 400 outputs the driving voltage to the unit cell (UC) through the bit lines BL0~BLN. In this case, because the bit line BL has a voltage level higher than that of the word line WL, a forward current flows in the switching element contained in the unit cell (UC).

As a result, a current flows in the PCR and a voltage proportional to a resistance value is applied to both ends of the PCR. The current-voltage converter 500 and the sense-amp 600 sense the value of a current applied to both ends of the PCR, thereby generating a sensing voltage (SAI).

In this case, when a forward current flows in the PCR, the change in the value of a current passing through the PCR is inversely proportional to the resistance of the PCR.

The current-voltage converter 500 converts a cell-sensing current flowing in the global bit line GBL into a voltage, and outputs a sensing voltage SAI. The non-volatile memory device for sensing data by reading a current variation requires the current-voltage converter 500.

The sense-amp 600 compares the sensing voltage SAI with a reference voltage VREF, amplifies a difference between the sensing voltage SAI and the reference voltage VREF, and thus outputs sensing data (SOb).

The data I/O unit 700 stores sensing data (SOb) generated from the sense-amp 600 during a predetermined period of time, and then outputs an output signal OUT. In addition, the data I/O unit 700 stores external input data for a predetermined period of time, and transmits an input signal IN to the global input/output (I/O) line GIO.

In addition, the data I/O unit 700 stores the identified data and then outputs the identified data to the external part.

If the data I/O unit 700 does not store the identified data, the current-voltage converter 500, the sense-amp 600, and the data I/O unit 700 need to be sequentially accessed from the cell array 100 storing data so as to read data.

However, provided that the data I/O unit 700 stores the identified data, even in a case where a user's access is limited only to the data I/O unit 700, the user can successfully read out data from the data I/O unit 700. Therefore, according to an embodiment of the present invention, since the access path required for reading data is curtailed, data can be read at high speed.

On the other hand, even in the case of writing data, if the data I/O unit 700 does not store data to be written, the data I/O unit 700, the write driver 400, and the cell array 100 need to be sequentially accessed for a writing operation.

However, if the data I/O unit 700 stores data to be written, the write operation can be properly performed even when access is limited to the data I/O unit 700 only. That is, the write operation can be done on the basis of data stored in the data I/O unit 700. Therefore, the path to be accessed for the data writing is curtailed, and data can be written at a high speed.

Figure 5:
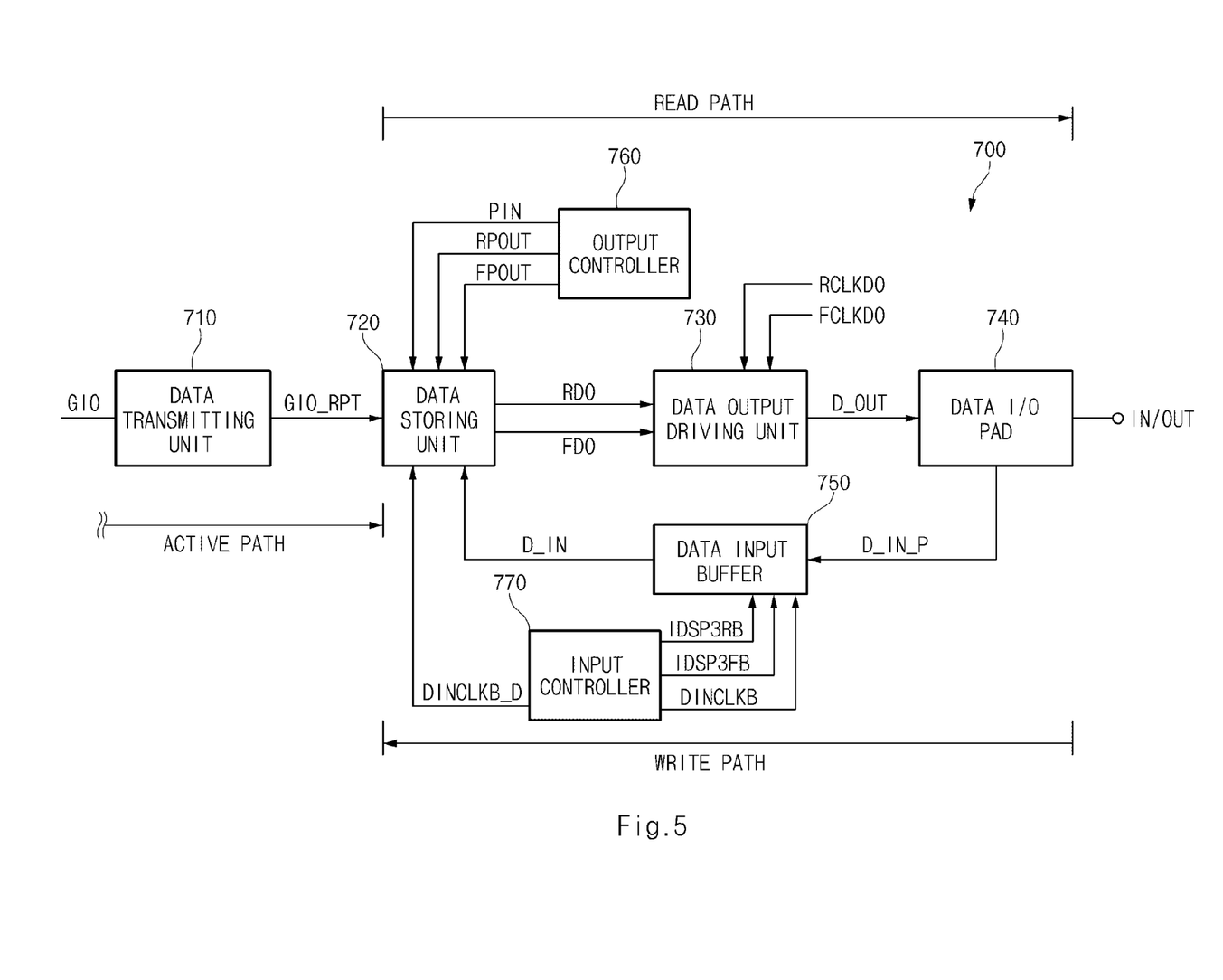
FIG. 5 is a detailed block diagram illustrating a data I/O unit shown in FIG. 4 according to an embodiment of the present invention.

FIG. 5 is a detailed block diagram illustrating the data I/O unit 700 shown in FIG. 4.

Referring to FIG. 5, the data I/O unit 700 according to an embodiment of the present invention includes a data transmitting unit 710, a data storing unit 720, a data output driving unit 730, a data I/O pad 740, a data input buffer 750, an output controller 760, and an input controller 770.

In this case, the data transmitting unit 710 receives data identified by the sense-amp 500 through a global I/O line GIO. The data transmitting unit 710 drives data identified by the sense-amp 500, and outputs the identified data (GIO_RPT) to the data storing unit 720.

The non-volatile memory device according to an embodiment of the present invention stores data in an external data transmission path of the cell array 100, such that it can curtail a data access path during the data read/write operation.

In this case, using the data transmitting unit 710, an embodiment of the present invention has the data storing unit 720 placed far away from the cell array 100 and at the same time closer to the DQ pad. In this case, the data transmitting unit 710 corresponds to a GIO repeater having the size of a large driver.

For example, if the global I/O line GIO and the data transmitting unit 710 are set to be long, the data storing unit 720 is located far away from the cell array 100. Otherwise, if the global I/O line GIO and the data transmitting unit 710 are set to be short, the data storing unit 720 is located closer to the cell array 100.

Provided that the length of the global I/O line GIO is adjusted without the data transmitting unit 710, the identified data signal can be distorted by line resistance. In contrast, if a signal is driven and transmitted using the data transmitting unit 710, the identified data can be correctly transmitted to the data storing unit 720.

In addition, the data storing unit 720 stores data received from the data transmitting unit 710. The data storing unit 720 includes a register to store data. In an embodiment of the present invention, the register may include a Row Data Buffer (RDB) array.

The memory device requires a programming operation time longer than the read operation time for outputting the stored data, such that it includes a Row Data Buffer (RDB) to compensate for an operation-time difference as well as to perform a specific operation.

In the conventional memory device, the aforementioned row data buffer (RDB) is placed in a bank. Therefore, the active path in the conventional memory device forms of an inner path of the bank, i.e., an operation path from the cell array to the sense-amp.

In this case, the distance from the bank to the data I/O pad (DQ PAD) becomes longer, such that the data reading or writing operation speed becomes slower. In addition, it is necessary for the RDB to be repeatedly located in every bank, resulting in an increased memory area.

However, an embodiment of the present invention forms the aforementioned RDB to be disposed closest to the data I/O pad 740, such that it improves an access speed and at the same time reduces a memory area.

The data storing unit 720 stores the same data as that of the unit cell of the cell array 100 in which the sensing operation is performed. Therefore, the non-volatile memory device according to the present invention can read the stored data by accessing only the data storing unit 720 without accessing the unit cell of the cell array 100, resulting in the implementation of a read operation. As a result, the access path of the read operation is curtailed, such that the read operation can be performed at a high speed.

In this case, the data storing unit 720 decides an output timing point of the stored data upon receiving a pulse input signal PIN, a rising pulse RPOUT and a falling pulse FPOUT from the output controller 760.

In this case, the pulse input signal PIN is an activation signal that controls data (GIO_RPT) received from the data transmitting unit 710 to be transmitted to the data storing unit 720. The rising pulse RPOUT is a signal for outputting data to the data output driving unit 730 at a pulse rising timing point, and the falling pulse FPOUT is a signal for outputting data to the output driving unit 730 at a pulse falling timing point.

Therefore, the data storage unit 720 is synchronized with the rising pulse RPOUT so as to output the rising data RDO, and is also synchronized with the falling pulse FPOUT so as to output the falling data FDO.

In an embodiment of the present invention, the data storing unit 720 may be disposed at a specific position that is the closest to the data I/O pad 740. In more detail, a pipe-latch array area of the conventional memory device based on the Low Power Double Data Rate (LPDDR) 2 specification may be formed in the aforementioned specific position.

The data output driving unit 730 drives the rising data RDO and the falling data FDO received from the data storing unit 720, such that it outputs the output data (D_OUT) to the data I/O pad 740. That is, the data output driving unit 730 is synchronized with the rising clock signal (RCLKDO) and thus outputs the rising data RDO as output data (D_OUT). In addition, the data output driving unit 730 is synchronized with the falling clock signal (FCLKDO) and thus outputs the falling data FDO as output data (D_OUT).

The output data (D_OUT) generated from the data output driving unit 730 is output externally through the data I/O pad 740.

The data I/O pad 740 may output data (OUT) to the external part during the read operation, or may receive data (IN) to be written from the external part during the write operation.

The data input buffer 750 receives input data (D_IN_P) to be written through the data I/O pad 740, buffers the received data (D_IN_P) to be written, and outputs the input data (D_IN) to the data storing unit 720.

In this case, the data input buffer 750 buffers data (D_IN_P) in response to input control signals (IDSP3RB and IDSP3FB) and an input clock signal DINCLKB, and generates input data (D_IN).

In this case, the input control signals (IDSP3RB and IDSP3FB) are generated by a data strobe signal (DQS). In this case, the input clock signal (DINCLKB) is a clock signal for allowing the data strobe signal (DQS) to be synchronized with the clock signal.

The clock delay signal (DINCLKB_D) generated from the input controller 770 is generated when the input clock signal (DINCLKB) is delayed for a predetermined period of time. The data storing unit 720 stores input data (D_IN) in response to the clock delay signal (DINCLKB_D).

The data storing unit 720 stores the same data as data to be written in the unit cell of the cell array 100. Therefore, the non-volatile memory device according to the present invention can write data in the unit cell of the cell array 100 by accessing only the data storing unit 720 without accessing the write driver. As a result, the access path of the write operation is curtailed, such that the write operation can be performed at a high speed.

Operations of the non-volatile memory device according to an embodiment of the present invention will hereinafter be described with reference to the accompanying drawings.

The embodiment of the present invention includes an active operation, a read operation, or a write operation.

First, in accordance with an embodiment of the present invention, during the active operation, the word line WL of the cell array 100 is enabled, and the cell data is amplified through the sense-amp 600, so that the amplified cell data is transmitted to the global I/O line GIO. Data applied to the global I/O line GIO is stored in the data storing unit 720 through the data transmitting unit 710.

In accordance with an embodiment of the present invention, during the active operation, output data of the bank (BANK) is transmitted to the global I/O line GIO and is then stored in the data storing unit 720 through the data transmitting unit 710. The aforementioned transmission path of the output data of the bank (BANK) is called an active path.

As long as objective time satisfies a tRCD specification required for a non-volatile memory device, a data transmission time from the sense amplifier 600 to the data storing unit 620 does not need to be considered. For example, the tRCD specification required for the non-volatile memory device can be extended up to 240 ns, such that the active operation can be sufficiently performed within the time meeting the tRCD specification.

In addition, since the memory device of the related art uses the pipe-latch, a plurality of global I/O lines (GIO) (e.g., four GIOs) may be required for each DQ pad.

However, in accordance with an embodiment of the present invention, no prefetch operation is performed in the active operation. Therefore, the number of global I/O lines GIO may be changed by controlling an operation time required for data transmission between the bank (BANK) and the row data buffer (RDB).

For example, provided that sensing data of the sense-amp 600 is sequentially transmitted through one global I/O line GIO and is stored in the data storing unit 720, an embodiment of the present invention can greatly reduce the number of global I/O lines GIO.

On the other hand, provided that a plurality of data is simultaneously transmitted using a plurality of global I/O lines GIO and is stored in the data storing unit 720, an embodiment of the present invention can greatly reduce the tRCD time.

Thereafter, during the read operation of data, an embodiment of the present invention outputs data stored in the data storing unit 720 in response to a read command (i.e., a read latency from the rising pulse RPOUT to the falling pulse FPOUT).

The read operation path according to the related art includes a path from the bank (BANK) to the DQ pad. That is, data amplified by the sense-amp is input to each global I/O line, and is output to the plurality of global I/O lines so as to perform the prefetch operation.

In contrast, an embodiment of the present invention uses a path from the data storing unit 720 to the data I/O pad 740 as a read path, such that it can greatly reduce the distance of the read path as compared to the related art. In this case, since the read path is reduced, a variation in temperature or skew can also be reduced, resulting in the implementation of a high-speed operation.

On the other hand, during the write operation, in response to the write command, input data (D_IN) received through the data I/O pad 740 and the data input buffer 750 is stored in the data storing unit 720.

In accordance with the related art, the write operation path is configured to include the DQ pad, the data transmitting unit 710, and the cell array of the bank (BANK).

In contrast, in accordance with an embodiment of the present invention, the write operation path is configured to further include the data I/O pad 740, the data input buffer 750, and the data storing unit 720, resulting in a reduced write operation path.

As apparent from the above description, the above-mentioned embodiments of the present invention have the following characteristics.

First, the non-volatile memory device according to an embodiment of the present invention has a Row Data Buffer (RDB) array placed adjacent to a DQ pad, such that the area of the memory is reduced compared to a case in which the RDB array is located in a bank.

Second, the non-volatile memory device according to an embodiment of the present invention reduces the distance between an RDB array and a DQ pad and thus curtails a read/write path length, resulting in the implementation of a high-speed operation.

Third, the non-volatile memory device according to an embodiment of the present invention has an RDB array for storing data formed in the exterior of a cell array, such that a malfunction of the data read/write operation due to temperature variation of the cell array can be prevented.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
   a bank including a plurality of unit cells and configured to output sensed data to a global input/output (I/O) line; and
   a data input/output (I/O) unit including a register and configured to store the sensed data in the register, the data input/output (I/O) unit being configured to store input data provided from an external node in the register during a write operation and output the sensed data stored in the register to the external node during a read operation.

2. The non-volatile memory device according to claim 1, wherein the register includes a row data buffer (RDB).

3. The non-volatile memory device according to claim 1, further comprising:

a data input/output (I/O) pad configured to communicate with the data input/output (I/O) unit, wherein the register is provided adjacent to the data input/output (I/O) pad.

4. The non-volatile memory device according to claim 1, wherein the data input/output (I/O) unit includes:

a data storing unit configured to store the input data therein, and store the sensed data received from the bank;

a data transmitting unit configured to transmit the sensed data stored in the data storing unit;

a data output driving unit configured to drive the sensed data received from the bank and output the driven data;

a data input/output (I/O) pad configured to output the driven data to the external node and receive the input data from the external node; and a data input buffer configured to buffer the input data received through the data input/output (I/O) pad, and output the buffered input data to the data storing unit.

5. The non-volatile memory device according to claim 4, wherein, during an active operation, an access path includes the bank, the data transmitting unit, and the data storing unit.

6. The non-volatile memory device according to claim 4, wherein, during a read operation, an access path includes the data storing unit, the data output driving unit, and the data input/output (I/O) pad.

7. The non-volatile memory device according to claim 4, wherein, during a write operation, an access path includes the data input/output (I/O) pad, the data input buffer, and the data storing unit.

8. The non-volatile memory device according to claim 4, further comprising:

an output controller configured to generate an input pulse signal for receiving data from the data transmitting unit, a rising pulse,—and a falling pulse, and output the—input pulse signal, the rising pulse, and the falling pulse to the data storing unit, wherein data is output in response to the rising pulse or the falling pulse.

9. The non-volatile memory device according to claim 4, further comprising:

an input controller configured to output an input control signal and an input clock signal to the data input buffer.

10. The non-volatile memory device according to claim 4, wherein the data storing unit outputs rising data at a rising timing point of a clock signal, and outputs falling data at a falling timing point of the clock signal.

11. The non-volatile memory device according to claim 10, wherein the data output driving unit is synchronized with a rising clock so as to output the rising data, and is synchronized with a falling clock so as to output the falling data.

12. The non-volatile memory device according to claim 1, wherein the data input/output (I/O) unit is configured to perform a data read or data write operation according to Low Power Double Data Rate (LPDDR) 2 specification.

13. A non-volatile memory device comprising:

a bank including a plurality of unit cells and configured to output sensed data to a global input/output (I/O) line;

a data transmitting unit configured to receive the sensed data from the bank through the global input/output (I/O) line and receive input data through a data input/output (I/O) pad;

a data storing unit configured to store the sensed data and the input data received from the data transmitting unit;

a data output driving unit configured to drive the sensed data stored in the data storing unit, and output the driven data to the data input/output (I/O) pad; and a data input buffer configured to buffer the input data received through the data input/output (I/O) pad, and output the buffered data to the data storing unit.

14. The non-volatile memory device according to claim 13, wherein the data storing unit includes a row data buffer (RDB).

15. The non-volatile memory device according to claim 13, wherein, during a read operation, an access path includes the data storing unit, the data output driving unit, and the data input/output (I/O) pad.

16. The non-volatile memory device according to claim 13, wherein, during a write operation, an access path includes the data input/output (I/O) pad, the data input buffer, and the data storing unit.

17. The non-volatile memory device according to claim 13, wherein, during an active operation, an access path includes the bank, the data transmitting unit, and the data storing unit.

18. The non-volatile memory device according to claim 13, further comprising:

an output controller configured to generate a input pulse signal for receiving data from the data transmitting unit, a rising pulse and a falling pulse-, and output the pulse input signal, the rising pulse, and the falling pulse to the data storing unit, wherein data is output in response to the rising pulse or the falling pulse.

19. The non-volatile memory device according to claim 13, further comprising:

an input controller configured to output an input control signal and an input clock signal to the data input buffer.

20. The non-volatile memory device according to claim 13, wherein the data storing unit outputs rising data at a rising timing point of a clock signal, and outputs falling data at a falling timing point of the clock signal.

21. The non-volatile memory device according to claim 20, wherein the data output driving unit is synchronized with a rising clock so as to output the rising data, and is synchronized with a falling clock so as to output the falling data.

22. The non-volatile memory device according to claim 13, wherein the data storing unit performs a read or write operation of data according to Low Power Double Data Rate (LP-DDR) 2 specification.

23. The non-volatile memory device according to claim 13, wherein the number of global input/output (I/O) lines is one or more according to tRCD specification, wherein 'tRCD' is a specific time at which a read command is received after the an active operation.

* * * * *